(12) United States Patent
Kato

(10) Patent No.: US 10,038,440 B2
(45) Date of Patent: Jul. 31, 2018

(54) ELECTRONIC APPARATUS

(71) Applicant: KYOCERA Document Solutions Inc., Osaka OT (JP)

(72) Inventor: Masaki Kato, Osaka (JP)

(73) Assignee: Kyocera Document Solutions, Inc. (JP)

(*) Notice: Subject to any disclaimer, the term of this patent is extended or adjusted under 35 U.S.C. 154(b) by 326 days.

(21) Appl. No.: 14/923,011

(22) Filed: Oct. 26, 2015

(65) Prior Publication Data

US 2016/0126743 A1    May 5, 2016

(30) Foreign Application Priority Data

Oct. 31, 2014 (JP) ................ 2014-222362

(51) Int. Cl.
*H02J 1/00* (2006.01)
*H02J 3/14* (2006.01)
*H03K 17/62* (2006.01)
*H03K 19/0185* (2006.01)

(52) U.S. Cl.
CPC . *H03K 17/6228* (2013.01); *H03K 19/018585* (2013.01)

(58) Field of Classification Search
CPC ........ H03K 17/6228; H03K 19/018585; H02J 4/00
USPC ............................................................. 307/31
See application file for complete search history.

(56) References Cited

U.S. PATENT DOCUMENTS

| 4,005,315 A | 1/1977 | Blauschild |
| 5,479,114 A | 12/1995 | Miura |
| 8,749,272 B1 * | 6/2014 | Schacht ............... H03K 5/2472 326/57 |

FOREIGN PATENT DOCUMENTS

| JP | H04-107790 | 4/1992 |
| JP | H07-135464 | 5/1995 |
| JP | 2005-339259 | 12/2005 |

* cited by examiner

Primary Examiner — Carlos Amaya

(57) ABSTRACT

An electronic apparatus includes a controller and a control signal generating circuit. The control signal generating circuit generates a first control signal and a second control signal different from each other for on-off control of two loads on the basis of a state of one three-state port of the controller.

3 Claims, 6 Drawing Sheets

FIG. 2

|          | PORT STATUS    | LOAD 11 | LOAD 12 |
|----------|----------------|---------|---------|
| STATUS#1 | HIGH OUTPUT    | ON      | OFF     |
| STATUS#2 | LOW OUTPUT     | OFF     | ON      |
| STATUS#3 | HIGH IMPEDANCE | OFF     | OFF     |

FIG. 4

|  | PORT STATUS | LOAD 11 | LOAD 12 |
|---|---|---|---|
| STATUS#1 | HIGH OUTPUT | ON | ON |
| STATUS#2 | LOW OUTPUT | OFF | OFF |
| STATUS#3 | HIGH IMPEDANCE | OFF | ON |

FIG. 6

|  | PORT STATUS | LOAD 11 | LOAD 12 |
|---|---|---|---|
| STATUS#1 | HIGH OUTPUT | ON | ON |
| STATUS#2 | LOW OUTPUT | OFF | OFF |
| STATUS#3 | HIGH IMPEDANCE | ON | OFF |

ELECTRONIC APPARATUS

CROSS-REFERENCE TO RELATED APPLICATIONS

This application relates to and claims priority rights from Japanese Patent Application No. 2014-222362, filed on Oct. 31, 2014, the entire disclosures of which are hereby incorporated by reference herein.

BACKGROUND

1. Field of the Present Disclosure

The present disclosure relates to an electronic apparatus.

2. Description of the Related Art

In an electronic apparatus, a microcomputer outputs a control signal through a port thereof and performs on-off control of a load using the control signal.

When such a microcomputer performs on-off control of two loads, on-off states of the two loads usually take four patterns and therefore since at least two control signals are required, two ports of the microcomputer are used for such control.

However, from the perspective of cost and the like, it is favorable to perform on-off control of such two loads by one port.

SUMMARY

An electronic apparatus according to an aspect of the present disclosure includes a controller and a control signal generating circuit. The control signal generating circuit generates a first control signal and a second control signal different from each other for on-off control of two loads on the basis of a state of one three-state port of the controller.

These and other objects, features and advantages of the present disclosure will become more apparent upon reading of the following detailed description along with the accompanied drawings.

BRIEF DESCRIPTION OF THE DRAWINGS

FIG. 2 shows a diagram that indicates a relationship between states of the port 2 of the CPU 1 and on-off states of the loads 11 and 12 in the electronic apparatus shown in FIG. 1;

FIG. 4 shows a diagram that indicates a relationship between states of the port 2 of the CPU 1 and on-off states of the loads 11 and 12 in the electronic apparatus shown in FIG. 3;

FIG. 6 shows a diagram that indicates a relationship between states of the port 2 of the CPU 1 and on-off states of the loads 11 and 12 in the electronic apparatus shown in FIG. 5.

DETAILED DESCRIPTION

Hereinafter, embodiments according to an aspect of the present disclosure will be explained with reference to drawings.

Embodiment 1

Figure 1:
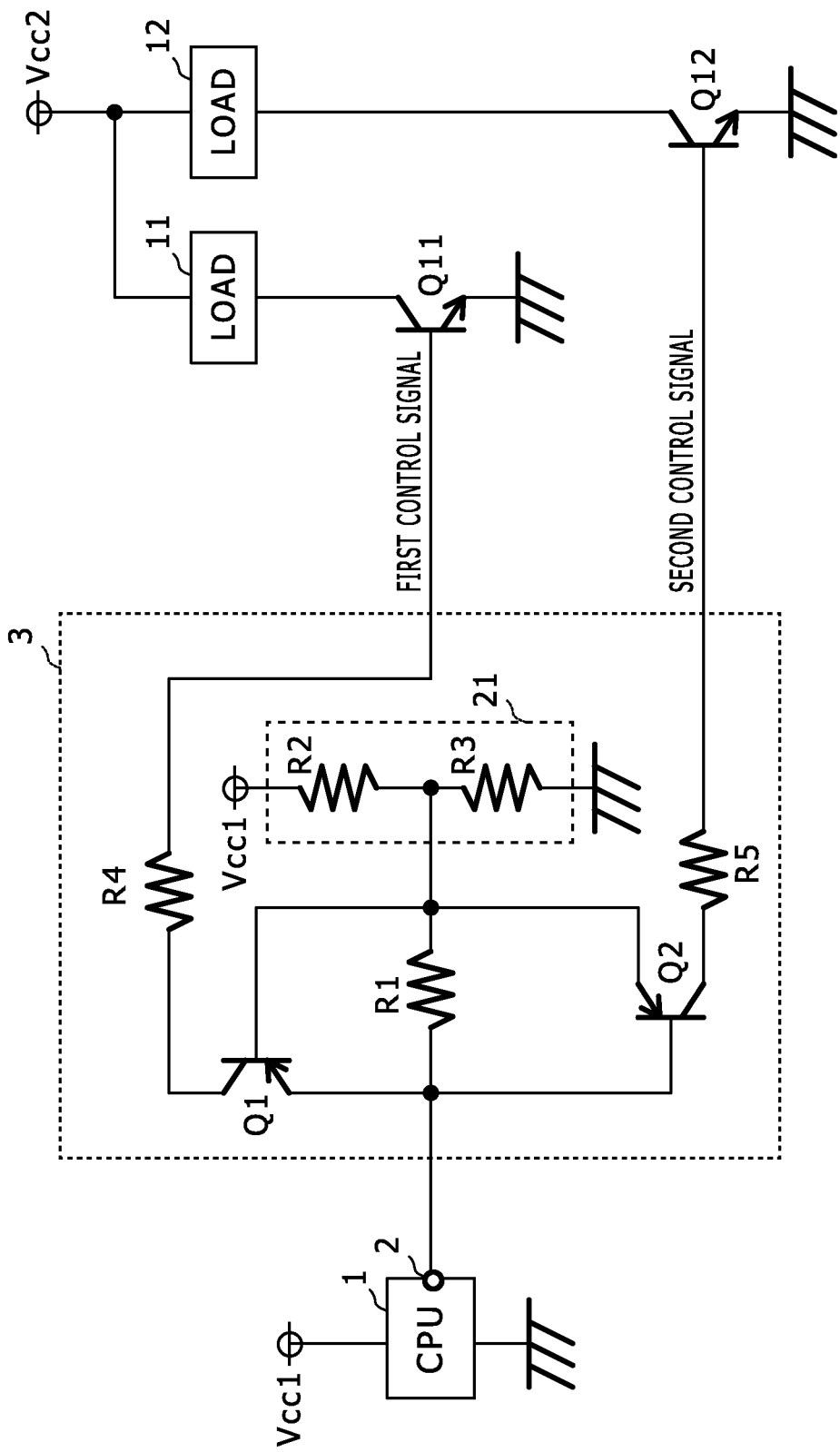
FIG. 1 shows a circuit diagram that indicates a configuration of an electronic apparatus according to Embodiment 1 of the present disclosure.

FIG. 1 shows a circuit diagram that indicates a configuration of an electronic apparatus according to Embodiment 1 of the present disclosure. The electronic apparatus shown in FIG. 1 is, for example, an image forming apparatus. In FIG. 1, a CPU (Central Processing Unit) 1 is a controller that acts in accordance with a program and includes a port 2. The port 2 is a three-state port capable of being set as three states that are high-level output, low-level output and high-impedance state. A microcomputer may be used instead of the CPU 1.

The control signal generating circuit 3 generates a first control signal and a second control signal different from each other for on-off control of two loads 11 and 12 on the basis of a state of the port 2 (i.e. one port) of the CPU 1.

Switching elements Q11 and Q12 are connected in series to the loads 11 and 12, respectively, and perform on-off operation according to levels of the first and the second control signals. Here the switching elements Q11 and Q12 are NPN-type transistors.

The loads 11 and 12 are control objects to be on-off controlled independently, such as fans, clutch solenoids, light emitting diodes, motors or the like.

In Embodiment 1, the control signal generating circuit 3 includes a voltage-dividing circuit 21, a current sensing resistor R1, and switching elements Q1 and Q2. The voltage-dividing circuit 21 generates an intermediate electrical potential at a connecting point of two resistors R2 and R3. One end of the current sensing resistor R1 is connected to the port 2 and the other end of the current sensing resistor R1 is connected to the connecting point. The switching element Q1 is turned on when a voltage between the ends of the current sensing resistor R1 is positive and is turned off when the voltage between the ends of the current sensing resistor R1 is zero or negative and thereby changes a level of the first control signal. The switching element Q2 is turned on when a voltage between the ends of the current sensing resistor R1 is negative and is turned off when the voltage between the ends of the current sensing resistor R1 is zero or positive and thereby changes a level of the second control signal.

The switching element Q1 outputs the first control signal through a resistor R4 and the switching element Q2 outputs the second control signal through a resistor R5. Here the switching elements Q1 and Q2 are PNP-type transistors.

The following part explains a behavior of the electronic apparatus of Embodiment 1.

FIG. 2 shows a diagram that indicates a relationship between states of the port 2 of the CPU 1 and on-off states of the loads 11 and 12 in the electronic apparatus shown in FIG. 1.

When the state of the port 2 is set as high-level output, current flows from the port 2 toward the voltage-dividing circuit 21. Therefore, the switching element Q1 is turned on and the switching element Q2 is turned off. Consequently, the level of the first control signal is set as a high level and the level of the second control signal is set as a low level. In this status, the switching element Q11 is turned on and the switching element Q12 is turned off and consequently the load 11 gets ON state and the load 12 gets OFF state.

Further, when the state of the port 2 is set as low-level output, current flows from the voltage-dividing circuit 21 toward the port 2. Therefore, the switching element Q2 is turned on and the switching element Q1 is turned off. Consequently, the level of the second control signal is set as the high level and the level of the first control signal is set as the low level. In this status, the switching element Q12 is turned on and the switching element Q11 is turned off and consequently the load 12 gets ON state and the load 11 gets OFF state.

Furthermore, when the state of the port 2 is set as high-impedance state, current that flows through the current sensing resistor R1 is substantially zero. Therefore, both of the switching elements Q1 and Q2 are turned off. Consequently, both of the levels of the first and the second control signals are set as the low level. In this status, both of the switching elements Q11 and Q12 are turned off and consequently both of the loads 11 and 12 get OFF state.

In the aforementioned Embodiment 1, two control signals for on-off control are generated on the basis of a state of the port 2, i.e. only one port, of the controller. Further, in Embodiment 1, current flows through the current sensing resistor R1 in different directions in accordance with the output of the port 2, and when the state of the port 2 is high-impedance state, the current that flows the current sensing resistor R1 is substantially zero, and the first and the second control signals are generated on the basis of the voltage between the ends of the current sensing resistor R1; and therefore malfunction due to noise or the like is restrained.

Embodiment 2

Figure 3:
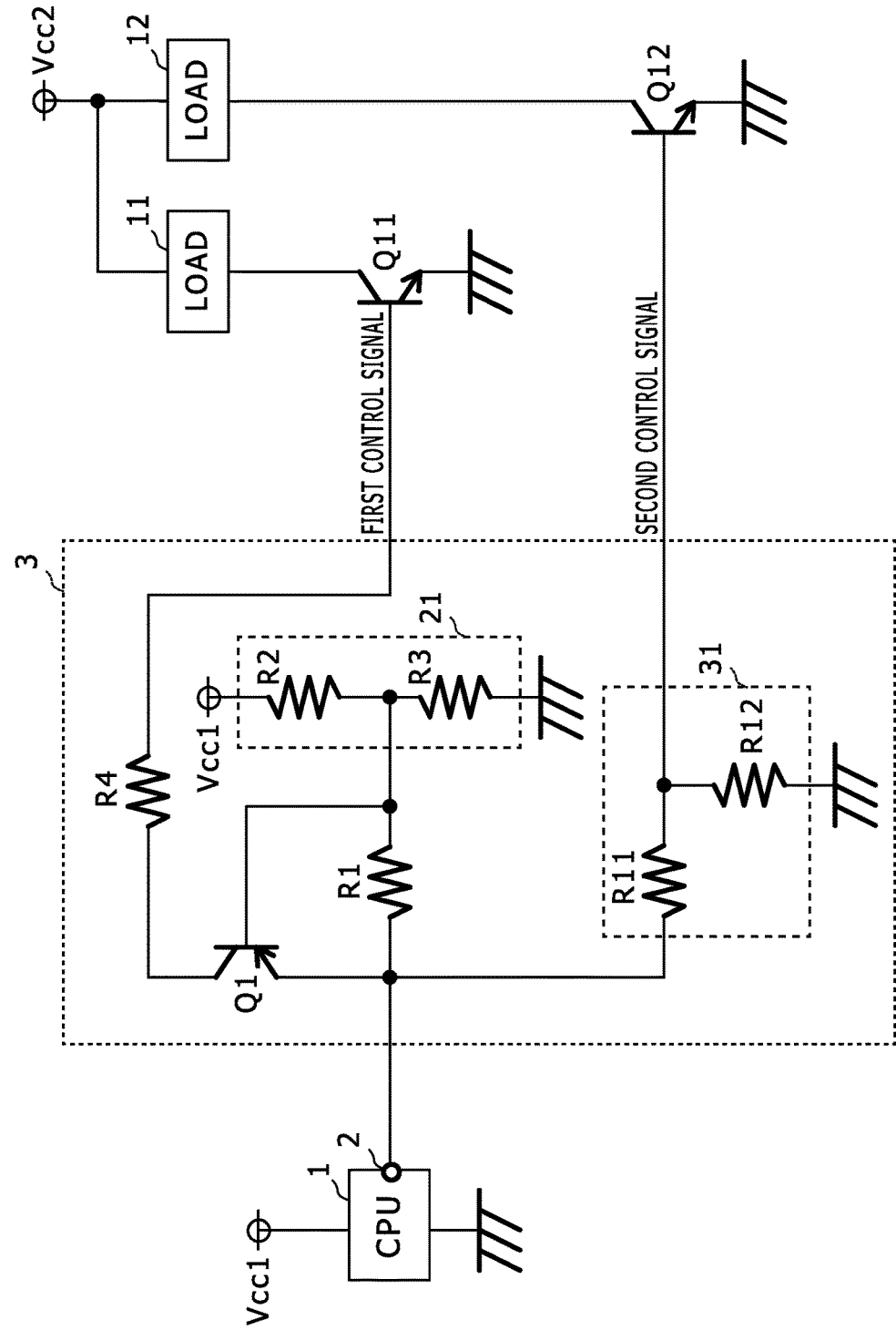
FIG. 3 shows a circuit diagram that indicates a configuration of an electronic apparatus according to Embodiment 2 of the present disclosure.

FIG. 3 shows a circuit diagram that indicates a configuration of an electronic apparatus according to Embodiment 2 of the present disclosure. Embodiment 2 uses a control signal generating circuit 3 different from that of Embodiment 1. The other parts of the configuration in FIG. 3 are similar to those in Embodiment 1, and therefore are not explained here.

The control signal generating circuit 3 shown in FIG. 3 includes the voltage-dividing circuit 21, the current sensing resistor R1, the switching element Q1 and the resistor R4 as well as Embodiment 1.

Further, the control signal generating circuit 3 shown in FIG. 3 includes a voltage-dividing circuit 31 that divides an electrical potential of the port 2 (i.e. a voltage between the port 2 and the ground). An electrical potential at a connecting point of the resistors R11 and R12 (i.e. a voltage between the connecting and the ground) in the voltage-dividing circuit 31 is output as the second control signal. The voltage-dividing circuit 31 sets the second control signal as a level corresponding to ON state of the load 12 when the state of the port 2 is high-level output, sets the second control signal as a level corresponding to OFF state of the load 12 when the state of the port 2 is low-level output, and sets the second control signal as a level corresponding to ON state of the load 12 when the state of the port 2 is high-impedance state.

The following part explains a behavior of the electronic apparatus of Embodiment 2.

FIG. 4 shows a diagram that indicates a relationship between states of the port 2 of the CPU 1 and on-off states of the loads 11 and 12 in the electronic apparatus shown in FIG. 3.

When the state of the port 2 is set as high-level output, current flows from the port 2 toward the voltage-dividing circuit 21. Therefore, the switching element Q1 is turned on and thereby the first control signal has the high level and thereby the switching element Q11 is turned on, and consequently the load 11 get ON state. On the other hand, the second control signal has an electrical potential obtained by dividing a voltage of the port 2 (i.e. the high level) with the voltage-dividing circuit 31, and here, has a level corresponding to ON state of the load 12. In other words, resistance values of the resistors R11 and R12 are selected so that the second control signal turns on the switching element Q12 in this status. Therefore, in this status, the switching element Q12 is turned on and thereby the load 12 gets ON state.

Further, when the state of the port 2 is set as low-level output, current flows from the voltage-dividing circuit 21 toward the port 2. Therefore, the switching element Q1 is turned off and thereby the first control signal has the low level and thereby the switching element Q11 is turned off, and consequently the load 11 gets OFF state. On the other hand, the second control signal has an electrical potential obtained by dividing a voltage of the port 2 (i.e. the low level) with the voltage-dividing circuit 31, namely has the low level, and thereby the switching element Q12 is turned off and thereby the load 12 gets OFF state.

Furthermore, when the state of the port 2 is set as high-impedance state, current flows through the resistor R2, the current sensing resistor R1, and the resistors R11 and R12. Therefore, the switching element Q1 is turned off and thereby the first control signal has the low level and thereby the switching element Q11 is turned off, and consequently the load 11 gets OFF state. On the other hand, the second control signal has a level corresponding to ON state of the load 12, and thereby the switching element Q12 is turned on and thereby the load 12 gets ON state. In other words, resistance values of the resistors R1, R2, R11 and R12 are selected so that the second control signal turns on the switching element Q12 in this status.

In the aforementioned Embodiment 1, two control signals for on-off control of the loads 11 and 12 are generated on the basis of a state of the port 2, i.e. only one port.

Embodiment 3

Figure 5:
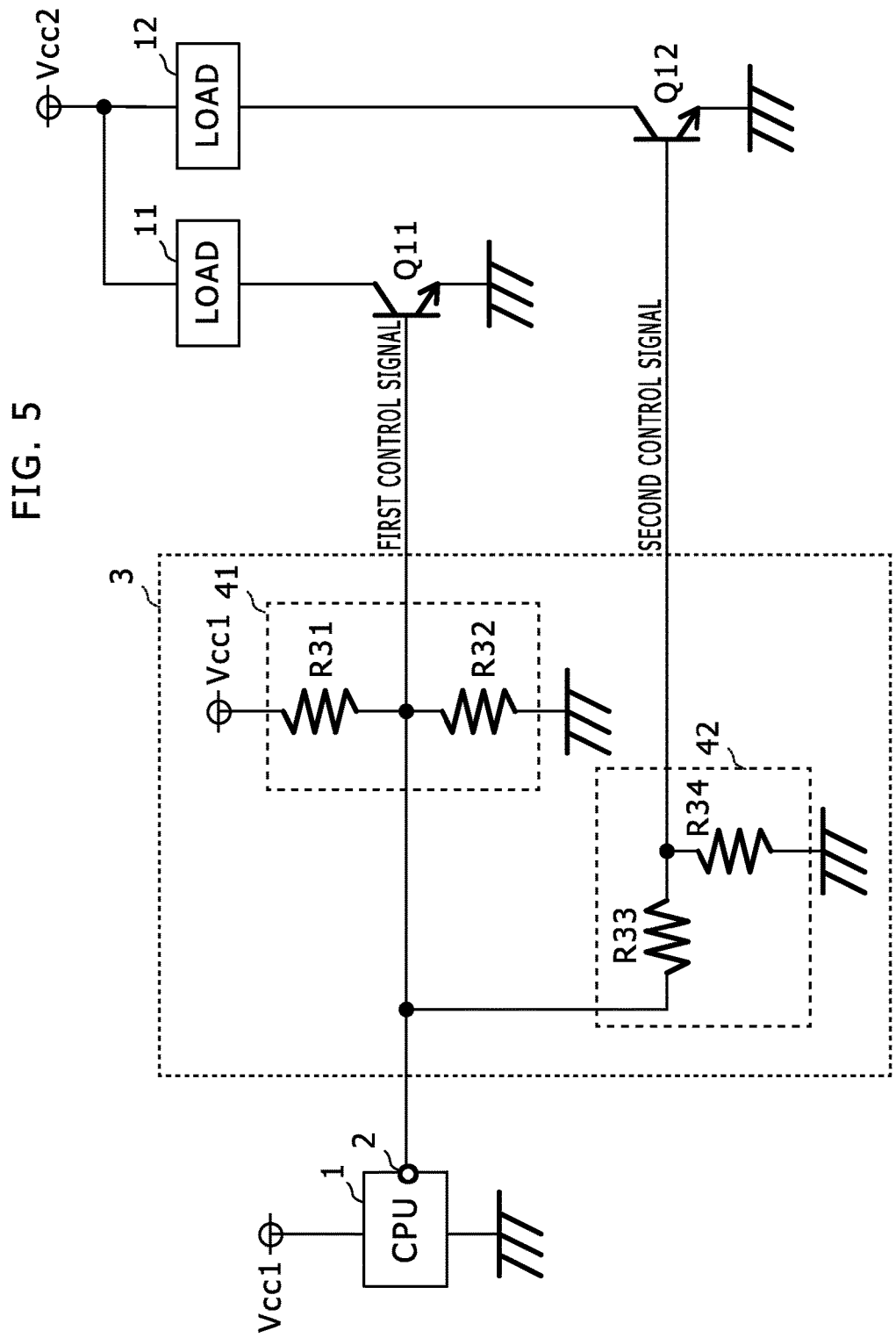
FIG. 5 shows a circuit diagram that indicates a configuration of an electronic apparatus according to Embodiment 3 of the present disclosure.

FIG. 5 shows a circuit diagram that indicates a configuration of an electronic apparatus according to Embodiment 3 of the present disclosure. Embodiment 3 uses a control signal generating circuit 3 different from those of Embodiments 1 and 2. The other parts of the configuration in FIG. 5 are similar to those in Embodiment 1 or 2, and therefore are not explained here.

The control signal generating circuit 3 shown in FIG. 5 sets a level of the first control signal as a level of the port 2. Further, in the control signal generating circuit 3 shown in FIG. 5, a voltage-dividing circuit 41 connects a connecting point of two resistors R31 and R32 to the port 2, and during high-impedance state of the port 2, sets the first control signal as a level corresponding to ON state of the load 11.

A voltage-dividing circuit 42 divides an electrical potential of the port 2 (i.e. a voltage between the port 2 and the ground) using resistors R33 and R34 connected in series to each other. The second voltage-dividing circuit 42 sets the second control signal as a level corresponding to ON state of the load 12 when the state of the port 2 is high-level output, sets the second control signal as a level corresponding to OFF state of the load 12 when the state of the port 2 is low-level output, and sets the second control signal as a level corresponding to OFF state of the load 12 when the state of the port 2 is high-impedance state.

The following part explains a behavior of the electronic apparatus of Embodiment 3.

FIG. 6 shows a diagram that indicates a relationship between states of the port 2 of the CPU 1 and on-off states of the loads 11 and 12 in the electronic apparatus shown in FIG. 5.

When the state of the port 2 is set as high-level output, the first control signal has the high level and thereby the switching element Q11 is turned on and thereby the load 11 gets ON state. On the other hand, the second control signal has an electrical potential obtained by dividing a voltage of the port 2 (i.e. the high level) with the voltage-dividing circuit 42, and here, has a level corresponding to ON state of the load 12. In other words, resistance values of the resistors R33 and R34 are selected so that the second control signal turns on the switching element Q12 in this status. Therefore, in this status, the switching element Q12 is turned on and thereby the load 12 gets ON state.

Further, when the state of the port 2 is set as low-level output, the first control signal has the low level and thereby the load 11 gets OFF state. On the other hand, the second control signal has an electrical potential obtained by dividing a voltage of the port 2 (i.e. the low level) with thevoltage-dividing circuit 42, namely has the low level, and thereby the switching element Q12 is turned off and thereby the load 12 gets OFF state.

Furthermore, when the state of the port 2 is set as high-impedance state, levels of the first and the second control signals are given on the basis of the resistors R31, R32, R33 and R34, and here the first control signal has a level corresponding to ON state of the load 11 and the second control signal has a level corresponding to OFF state of the load 12. Consequently the switching element Q11 is turned on and the switching element Q12 is turned off, and thereby the load 11 gets ON state and the load 12 gets OFF state. In other words, resistance values of the resistors R31, R32, R33 and R34 are selected so that the switching elements Q11 and Q12 act in the aforementioned manner in accordance with the first and the second control signals in this status.

In the aforementioned Embodiment 3, two control signals for on-off control of the loads 11 and 12 are generated on the basis of a state of the port 2, i.e. only one port.

The description has been presented for purposes of illustration and description, and is not intended to be exhaustive or limited.

It should be understood that various changes and modifications to the embodiments described herein will be apparent to those skilled in the art. Such changes and modifications may be made without departing from the spirit and scope of the present subject matter and without diminishing its intended advantages. It is therefore intended that such changes and modifications be covered by the appended claims.

What is claimed is:

1. An electronic apparatus, comprising:
a controller;
a control signal generating circuit that generates a first control signal and a second control signal different from each other for on-off control of two loads on the basis of a state of a three-state port of the controller, wherein the control signal generating circuit comprises:
a voltage-dividing circuit that generates an intermediate electrical potential at a connecting point of two resistors;
a current sensing resistor of which one end is connected to the three-state port and the other end is connected to the connecting point;
a first switching element that is turned on when a voltage between the ends of the current sensing resistor is positive and is turned off when the voltage between the ends of the current sensing resistor is zero or negative and thereby generates the first control signal; and
a second switching element that is turned on when a voltage between the ends of the current sensing resistor is negative and is turned off when the voltage between the ends of the current sensing resistor is zero or positive and thereby generates the second control signal.

2. An electronic apparatus, comprising:
a controller;
a control signal generating circuit that generates a first control signal and a second control signal different from each other for on-off control of two loads on the basis of a state of a three-state port of the controller, wherein the control signal generating circuit comprises:
a first voltage-dividing circuit that generates an intermediate electrical potential at a connecting point of two resistors;
a current sensing resistor of which one end is connected to the three-state port and the other end is connected to the connecting point;
a switching element that is turned on when a voltage between the ends of the current sensing resistor is positive and is turned off when the voltage between the ends of the current sensing resistor is negative and thereby generates the first control signal; and
a second voltage-dividing circuit that divides an electrical potential of the three-state port;
wherein the second voltage-dividing circuit sets the second control signal as a level corresponding to ON state of the load when the state of the three-state port is high-level output, sets the second control signal as a level corresponding to OFF state of the load when the state of the three-state port is low-level output, and sets the second control signal as a level corresponding to ON state of the load when the state of the three-state port is high-impedance state.

3. An electronic apparatus, comprising:
a controller;
a control signal generating circuit that generates a first control signal and a second control signal different from each other for on-off control of two loads on the basis of a state of a three-state port of the controller, wherein:
the control signal generating circuit sets a level of the first control signal as a level of the three-state port; and
the control signal generating circuit comprises:
a first voltage-dividing circuit that connects a connecting point of two resistors to the three-state port, and during high-impedance state of the three-state port, sets the first control signal as a level corresponding to ON state of the load; and
a second voltage-dividing circuit that divides an electrical potential of the three-state port;
wherein the second voltage-dividing circuit sets the second control signal as a level corresponding to ON state of the load when the state of the three-state port is high-level output, sets the second control signal as a level corresponding to OFF state of the load when the state of the three-state port is low-level output, and sets the second control signal as a level corresponding to OFF state of the load when the state of the three-state port is high-impedance state.

* * * * *